United States Patent [19]

Avery

[11] Patent Number: 4,518,918

[45] Date of Patent: May 21, 1985

[54] FERROMAGNETIC ARTICLE DETECTOR WITH DUAL HALL-SENSORS

[75] Inventor: Grant D. Avery, Loudon, N.H.

[73] Assignee: Sprague Electric Company, North Adams, Mass.

[21] Appl. No.: 425,213

[22] Filed: Sep. 28, 1982

[51] Int. Cl.³ .................. G01B 7/14; G01R 33/06; H01L 43/06

[52] U.S. Cl. .................. 324/208; 324/251; 338/32 H

[58] Field of Search .......... 324/207, 208, 251, 173, 324/174; 338/32 H, 32 R; 323/368

[56] References Cited

U.S. PATENT DOCUMENTS

| 2,852,732 | 9/1958 | Weiss | 323/94 |
| 2,942,177 | 6/1960 | Neumann et al. | 324/37 |
| 2,946,755 | 7/1960 | Kuhrt | 324/251 |
| 3,816,766 | 6/1974 | Anselmo et al. | 307/278 |
| 3,846,697 | 11/1974 | Cila et al. | 324/208 |
| 4,296,410 | 10/1981 | Higgs et al. | 340/686 |

Primary Examiner—Gerard R. Strecker
Assistant Examiner—Walter E. Snow

[57] ABSTRACT

Two identical integrated circuit (IC) chips are mounted at a pole of a magnet. Each IC chip includes a Hall-element followed by an amplifier. A comparator is connected to the outputs of the IC chips to produce a voltage that is directly related to the difference between the magnetic field strengths at the two IC chips that may be due to a ferromagnetic article that is closer to one IC chip than the other.

10 Claims, 3 Drawing Figures

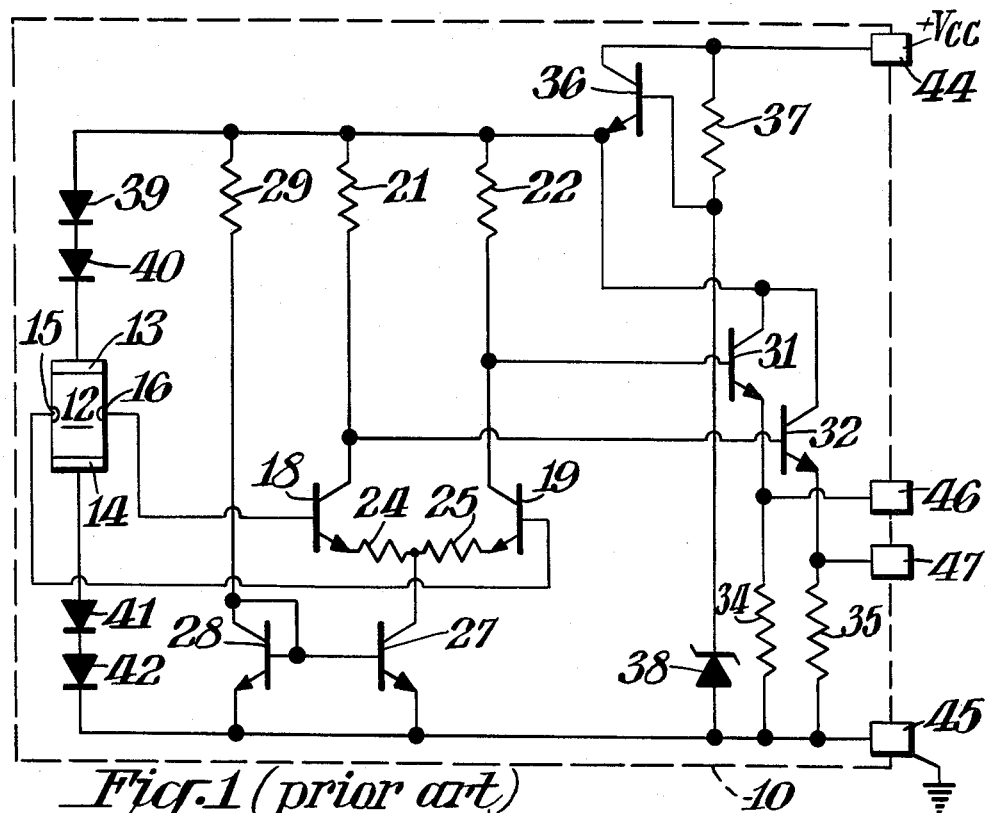
Fig.1 (prior art)
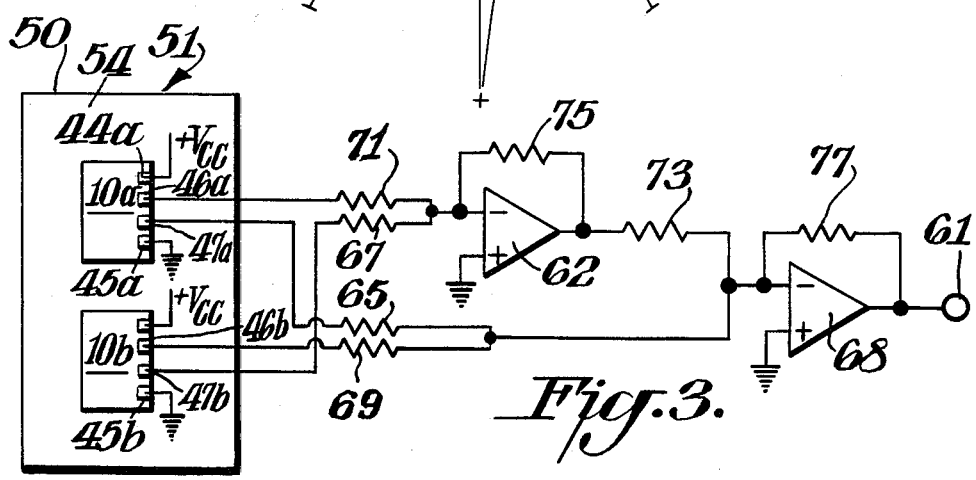
Fig.2.
Fig.3.

FERROMAGNETIC ARTICLE DETECTOR WITH DUAL HALL-SENSORS

BACKGROUND OF THE INVENTION

This invention relates to a ferrous-metal detector of the kind having a magnet with a Hall-effect element attached, and more particularly to such a detector having two spaced integrated circuit Hall sensors attached to a magnet.

When a ferromagnetic article passes by a magnet-biased Hall-effect element the Hall voltage changes due to the distortion of the magnet bias field. However, with no ferromagnetic article nearby, the Hall element output voltage is a large steady value. Output signal voltages are always superimposed on this large DC voltage. It is therefore customary to capacitor-couple or otherwise AC-couple the output of such detectors to an amplifier and/or another signal responsive device. Besides the extra expense of providing such an AC coupling, the system can only respond to moving ferromagnetic articles that must travel at least fast enough that the AC coupling means can follow it without substantial attenuation.

A more satisfactory solution to this problem is a circuit means for compensating the bias field as is described in the copending patent application to Avery and Higgs Ser. No. 342,687, filed Jan. 26, 1982, now U.S. Pat. No. 4,465,976, and assigned to the same assignee as is the present invention. A current is introduced at one or both output pads of the Hall-element to compensate for the bias field by opposing the generation of an output voltage due to the bias magnet. However, the sensitivity of this device is, as are most Hall-devices, a function of temperature.

The silicon integrated-circuit magnetic-field detector having a Hall-element and a Hall-voltage amplifier is described in the patent to Anselmo et al U.S. Pat. No. 3,816,766 issued June 11, 1974 and assigned to the same assignee as is the present invention. The Hall-element and the collector resistors in the differential amplifier are formed in epitaxial silicon simultaneously acquiring the same temperature coefficient. This substantially reduces the variations in the overall sensitivity with temperature changes. However, for certain applications it is desired to have greater stability with temperature as well as with changes in supply voltage. The later problem is partly accounted for by the on-board-voltage regulator in the Anselmo et al patent.

It is an object of the present invention to provide a ferromagnetic material detector having a high degree of stability in output voltage as a function of temperature and supply voltage.

It is a further object of this invention to provide such a detector having an output voltage with a low value DC component.

SUMMARY OF THE INVENTION

The ferromagnetic article detector of this invention comprises a magnet having two essentially identical integrated circuit chips spaced apart and mounted at a pole of the magnet. The chips are of the type having a Hall-element and an amplifier integrated and interconnected to the chip so that the output of the amplifier is a continuous, preferably linear, function of the magnitude of a magnetic field orthogonal to the major face of the chip. A comparator means is provided for producing a detector-output signal that is proportional to the difference between the output signals of the two amplifiers.

This detector provides a high degree of stability. In an invarient magnetic field, each chip output voltage changes as a function of temperature and supply voltage. However, since the two chips are identical, i.e. come from the same production line, the temperature coefficients of the doped integrated circuit regions that determine the characteristic changes with temperature of the circuit components, are the same in the two chips, and therefore tend to almost exactly null each other in the comparator means. Likewise since the nominal values of the IC components in each chip are nearly the same, and the circuits themselves are identical, the effects of changes in power supply voltage are also bucked out and eliminated from the output of the comparator.

Furthermore, the detector of this invention provides another kind of stability when used to detect the presence of a high-permeability-article under one chip and the absence of such under the other; e.g. the position of gear teeth. The accuracy with which this detector can sense such gear teeth positions is essentially unaffected for substantial changes in the distance between the detector and the periphery of the gear. Thus an unevenly worn or eccentric gear is accurately sensed and the criticality of the initial spacing at assembly in the machine is minimized. Also if a voltage threshold switching device such as a schmitt trigger circuit is used at the output of this detector to generate a logic signal corresponding to the position of a rotating gear, removal and then replacement of the sensor may change the air gap from what it was initially, and this detector can tolerate these changes to a much greater extent than could previous Hall-detectors without altering such position/signal correspondence.

BRIEF DESCRIPTION OF THE DRAWINGS

FIG. 1 shows a schematic diagram of a silicon integrated circuit Hall sensor.

FIG. 2 shows in a side view two such Hall sensors as that in FIG. 1, both being connected to the face of a magnet for detecting and enabling the counting of the teeth of an adjacent rotating gear, according to this invention.

FIG. 3 shows a schematic diagram of the dual sensors and magnet detector of FIG. 2 including a circuit for producing an output voltage proportional to the difference between the output voltages of the two sensors, according to this invention.

DESCRIPTION OF THE PREFERRED EMBODIMENTS

The integrated-circuit Hall sensor 10 of FIG. 1 includes a Hall element 12 having two current-supply electrodes 13, 14. Two Hall-output electrodes 15 and 16 are connected to the input of a differential amplifier stage that has two amplifying transistors 18 and 19, two collector resistors 21 and 22, two emitter-currents-balancing resistors 24 and 25 and an emitter-bias-current source consisting of transistors 27 and 28 and a resistor 29. Two emitter followers consist, respectively, of transistors 31 and 32 and emitter resistors 34 and 35. These emitter followers are connected to the outputs, respectively, of the differential-amplifier stage and have their outputs connected to integrated-circuit-chip-output pads 46 and 47, respectively. A simple voltage regulator circuit, made up of transistor 36, resistor 37, and zener diode 38, provides a modest degree of regulation to the supply voltage, $V_{cc}$, that will be applied across integrated-circuit-chip pads 44 and 45. Diodes 39, 40, 41 and 42 limit the voltage applied to the Hall-element 12 and thus limit the energizing current while helping to stabilize the Hall output voltage as a function of temperature.

Packaged Hall-sensor chips of this kind are manufactured by Sprague Electric Company, Concord, N.H., as type UGN 3501M. This device provides a nominal differential output of 1.4 mv/gauss. It may be convenient for use in detectors of this invention to substitute a potentiometer for the emitter resistors 24 and 25 and adjust the output voltage to zero with no magnetic field present.

Referring to FIG. 2, two Hall sensor chips 10a and 10b, each being essentially identical to the chips 10 represented in FIG. 1, are positioned spaced apart with a major face thereof lying in a plane 49. A bar magnet 50 is magnetized in the direction of magnet axis 52. A pole end 54 of the magnet 50 is about flat and transverse of the magnet axis 52.

This detector assembly 51 of chips 10a and 10b and magnet 50 is mounted adjacent a rotating gear 55. At the instant represented by FIG. 2, Hall-sensor chip 10b is aligned with a gear tooth 58 while Hall sensor chip 10a is aligned with the valley between teeth 58 and 59. In this first position, the magnetic flux density will, of course, be greater at chip 10b than at chip 10a. As the gear continues to rotate clockwise a second position is reached wherein the magnetic flux density is the same at chips 10a and 10b. Later yet, a third position is reached wherein chip 10a is symmetrically aligned with tooth 59 while at the same time chip 10b is symmetrically aligned with the valley between teeth 58 and 59.

With reference to FIG. 3, a circuit is shown that provides at a detector-output terminal 61 a voltage that is proportional to the difference between the differential output voltages of chips 10a and 10b. The differential output voltage from chip 10a appears across pads 46a and 47a. The differential output voltage from chip 10b appears across output pads 46b and 47b.

A first operational amplifier 62 has the inverting input terminal connected through resistors 65 and 67 to the output pads 46a and 47b, respectively, of chips 10a and 10b, respectively. Similarly, the inverting input terminal of operational amplifier 68 is connected to output pads 47a and 46b, respectively, of chips 10a and 10b. In addition, the inverting input terminal of amplifier 68 is connected through resistor 73 to the output of amplifier 62. Feedback resistors 75 and 77 associated with amplifiers 62 and 68, respectively, each have the same value, namely 10,000 ohms, as do all the other resistors 65, 67, 69, 71 and 73. Thus the voltage gains, e.g. from pad 46a to the output of amplifier 62 or from pad 46b to terminal 61, is unity.

That the circuit of FIG. 3 provides an output voltage that is proportional to the difference between the differential output voltages can be shown as follows. Recognizing that the operational amplifier gains are unity when cell resistors are the same value, and letting the voltages at output pads 46a, 47a, 46b and 47b be represented by the letters, A, B, C and D, respectively, then the output voltage $V_{62}$ at op-amp 62 is $$V_{62} = -(A+D)$$

and the output voltage $V_{61}$ at terminal 61 is $$\begin{aligned} V_{61} &= -V_{62} - (B + C) \\ &= (A + D) - (B + C) \\ &= (A - B) - (C - D). \end{aligned}$$

The operational amplifier gains may be other than unity. For example, the value of feedback resistor 77 may be increased ten-fold to 100,000 ohms resulting in a ten-fold increase in the output voltage at terminal 61, all else remaining the same.

For the above noted three salient positions of the gear 55 relative to a detector assembly 51 similar to that of FIG. 1 except using Sprague Hall-sensor UGN 3501U the currents were measured in the resistors of a ferrous-metal detector system constructed according to the circuit of FIG. 3 and mounted adjacent the periphery of a gear (55) as shown in FIG. 2. These measurements are summarized in Table I.

TABLE I

| Alignment | (FIG. 2) | Positions #1 10b & 58 | #2 — | #3 10a & 59 |
|---|---|---|---|---|
| Currents | 65 | 0.547 | 0.540 | 0.533 |
| at | 67 | 0.253 | 0.260 | 0.267 |
| resistor | 69 | 0.533 | 0.540 | 0.547 |
| (ma.) | 71 | 0.267 | 0.260 | 0.253 |
| (FIG. 3) | 73 | −0.786 | −0.800 | −0.814 |
| Output Voltage (mv) at | 61 | −280 | 0 | +280 |

The sensor chips 10a and 10b are type UGN 3501U, each nominally providing a differential output of 0.7 mv/gauss. Other means than the above noted potentiometer for obtaining an initial null may be used, e.g. providing an adjustable current sink/source (not shown) connected to the input of operational amplifier 68.

The magnet 50 is a ferrite magnet that is 1 inch (2.5 cm) long and has a 0.25 inch (0.64 cm) square pole end 54. It is a type Ceramic-8 made by Arnold Engineering Co., Marengo, Ill.

A major advantage of the detector of this invention is its reliable resolution of the gear teeth or the like over a wide range of gap distances between the gear (55) and the detector assembly (51). Thus the original installation of the detector assembly (51) is not critical and eccentricity of the gear itself is no longer of any consequence as is illustrated in the data of Table II.

The ferromagnetic material sensor 51 described above, was placed adjacent a rotating gear 55 at various distances therefrom. For several such gap distances, the detector peak to peak output voltages were measured as indicated in Table II.

TABLE II

| GAP | | Output (at 61) |
|---|---|---|
| inches | (mm) | millivolts |
| 0.005 | 0.13 | 400 |
| 0.015 | 0.38 | 260 |
| 0.032 | 0.81 | 160 |
| 0.064 | 1.63 | 40 |

The output voltage from a single sensor is roughly proportional to the reciprocal of the square of the gap distance. Thus over the gap range from 0.005 inch to 0.064 inch, the output voltage drops by a factor of 80 rather than the drop by a factor of 10 as for the detector of this invention represented in Table II.

What is claimed is:

1. A ferromagnetic article detector comprising:
   (a) a pair of essentially identical silicon-integrated-circuit-Hall-sensor chips each of the type capable of providing between a first and a second output thereof a differential output voltage that is a continuous function of the strength of a magnetic field perpendicular to a major face of the integrated circuit chip, each of said chips comprising a Hall element being co-planar with said major face of said each chip and a differential amplifier having an input connected to the output of said Hall element; and having an output connected to said first and second outputs
   (b) a permanent magnet in the shape of a bar having at least one substantially flat end and being magnetized in a direction perpendicular to said end, said pair of integrated circuit chips being mounted spaced apart at said magnet end with their major surfaces lying in a plane that is parallel to said bar end;
   (c) a differential comparator means having one and another inputs; and
   (d) a voltage summing means coupling to said one comparator means input a sum of the output voltages at the first differential output of one of said Hall-sensor chips and the second differential output of the other of said Hall sensor chips, and coupling to said another comparator means input a sum of the output voltages at the second differential output of said one chip and at the first differential output of said other chip, said differential comparator means being for producing a detector-output-signal that is proportioned to the difference between the output signals of said two amplifiers.

2. The detector of claim 1 wherein said integrated circuit chips are powered from the same power supply.

3. The detector of claim 1 wherein each of said integrated circuit amplifiers consists of a differential transistor amplifier portion and a pair of emitter followers connected between the outputs of said differential amplifier portion and of said first and second outputs, respectively, of said Hall-sensor chip.

4. The detector of claim 3 wherein said amplifier portion is comprised of at least one differential amplifier stage including an emitter-bias-current source circuit.

5. The detector of claim 1 wherein each of said Hall sensor chips includes an on-board voltage regulating means for DC power supply voltage that energizes said Hall-element and said amplifier.

6. The detector of claim 1 wherein said summing means is comprised of four summing resistors, respectively connecting said first output of said one chip to said one comparator means input, connecting said second output of said one ship to said another comparator means input, connecting said first output of said other chip to said another comparator means input, and connecting said second output of said other chip to said one comparator means input.

7. The detector of claim 1 wherein the ohmic values of said four summing resistors are mutually equal.

8. The detector of claim 1 wherein said comparator means is comprised of a first operational amplifier, the inverting input to said first operational amplifier serving as said one comparator means input; a second operational amplifier, the inverting input of said second operational amplifier serving as said another comparator means input, said inverting input of said second operational amplifier being coupled to the output of said first operational amplifier and the output of said second operational amplifier serving as the output of said comparator means.

9. The detector of claim 8 wherein said comparator means additionally comprises first and second feed back resistors connected between said output and inverting input of said first and second operational amplifiers respectively.

10. The detector of claim 9 wherein said comparator means additionally comprises a coupling resistor serving said coupling function between said second operational amplifier input and said first operational amplifier output.

* * * * *